United States Patent [19]

Furman

[11] 4,211,939
[45] Jul. 8, 1980

[54] OPERATIONAL AMPLIFIER WITH SWITCHING ERROR ELIMINATION

[76] Inventor: Anatoly V. Furman, ulitsa Chkalova, 21, kv. 6, Zhukovsky Moskovskoi oblasti, U.S.S.R.

[21] Appl. No.: 885,022

[22] Filed: Mar. 9, 1978

[51] Int. Cl.² .............................................. G06G 7/12
[52] U.S. Cl. .................................. 307/229; 307/230; 307/251; 328/127
[58] Field of Search ............... 307/229, 230, 251, 254; 328/127

[56] References Cited

U.S. PATENT DOCUMENTS 3,602,707  8/1971  Jones ..................................... 307/229

FOREIGN PATENT DOCUMENTS 2615863  11/1976  Fed. Rep. of Germany ........... 307/229

OTHER PUBLICATIONS

IBM Tech. Discl. Bttn., Digital-to-Synchro Converter by G. Hodges, vol. 12, No. 10, 3/70, p. 1639.

Primary Examiner—Stanley D. Miller, Jr.
Assistant Examiner—B. P. Davis
Attorney, Agent, or Firm—Haseltine, Lake & Waters

[57] ABSTRACT

A switching device, comprising two identical active switching components connected in series and made as an operational amplifier with keying elements in the negative feedback circuit and two identical operational amplifier null bias voltage memory circuits, the inputs of each of said circuits being connected to the outputs of the operational amplifiers and the outputs, to the non-inverting inputs of the operational amplifiers so that the output of the first memory circuit is connected to the non-inverting input of the operational amplifier to whose output is connected the second memory circuit and the output of the second memory circuit is connected to the non-inverting input of the operational amplifier to whose output is connected the first memory circuit.

6 Claims, 2 Drawing Figures

OPERATIONAL AMPLIFIER WITH SWITCHING ERROR ELIMINATION

FIELD OF THE INVENTION

The present invention relates to means for switching electrical signals and more particularly it relates to a switching device. It may be advantageously used in precision DC signal commutators and especially so in electrical signal multiplexers.

BACKGROUND OF THE INVENTION

At present a switching device is known that is essentially an active switching component using an operational amplifier with keying elements in a negative feedback circuit. Cutting in of the keying elements closes the profound negative feedback circuit in the operational amplifier and the switching component transient resistance drops to a low level. However, the operational amplifier null bias voltage results in an unstable residual voltage across the active switching component. This disadvantage causes errors in DC signal switching and limits the sphere of application of the switching devices on an active switching component.

BRIEF DESCRIPTION OF THE INVENTION

The object of this invention is to provide a switching device with a low and stable value of residual voltage accross the contacts of the active keying circuit in the closed state.

The above and other objects of the invations are attained in a switching device on an active switching component made in the form of an operational amplifier with keying elements in the negative feedback circuit, according to the invention, which comprises two indentical active switching components connected in series and two identical operational amplifier null bias voltage memory circuits, inputs of each of said circuits being connected to outputs of the operational amplifiers, and outputs, to non-inverting inputs of said amplifiers, the output of the first memory circuit being connected to the non-inverting input of the operational amplifier to whose output is connected the second memory circuit, while the output of the second memory circuit is connected the non-inverting input of the operational amplifier to whose output is connected to the first memory circuit.

Each operational amplifier null bias voltage memory circuit may comprise a capacitor one of the leads thereof being connected to a center tap of the operational amplifier supply source, while the other lead is connected through a keying element to the non-inverting input of one operational amplifier and through a charging keying element, to the output of the other operational amplifier, and two keying elements adapted to short-circuit the inputs of the operational amplifier at the moment of memorizing, one of said keying elements being connected between the output of the operational amplifier and the inverting input thereof, while the other, between the non-inverting input and the center tap of the operational amplifier supply sources.

Such an arrangement provides for drastic reduction of residual voltage and its instability across the closed active switching component.

The invention will now be explained in greater detail with reference to the embodiments thereof which are represented in the accompanying drawings, wherein.

Figure 1:
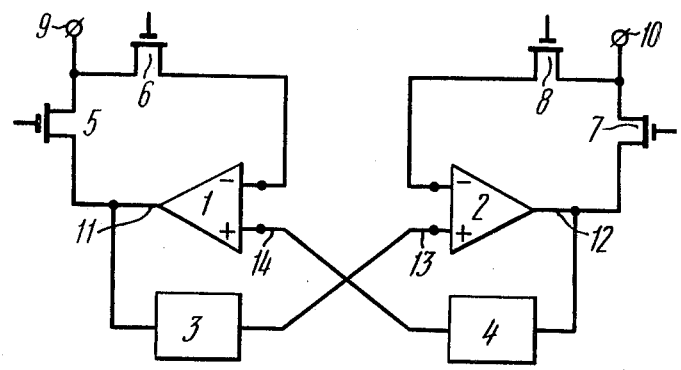
FIG. 1 is a block diagram of the switching device according to the invention.

The switching device, according to the invention, comprises two active switching components connected in series and each consisting essentially of an operational amplifier 1, 2 (FIG. 1), and two null bias voltage memory circuits 3, 4 of said amplifiers 1, 2. Each operational amplifier 1, 2 enveloped with a profound feedback circuit by keying elements 5, 6, 7, 8. The taps of connection of the keying elements 5 and 6, 7 and 8 serve as output terminals 9 and 10 of the switching device. The inputs of the circuits 3 and 4 are connected to the outputs 11 and 12 of the amplifiers 1 and 2. The output of the circuit 3 is connected to the non-inverting input 13 of the operational amplifier 2, the output of the circuit 4 is connected to the non-inverting input 14 of the operational amplifier 1.

Figure 2:
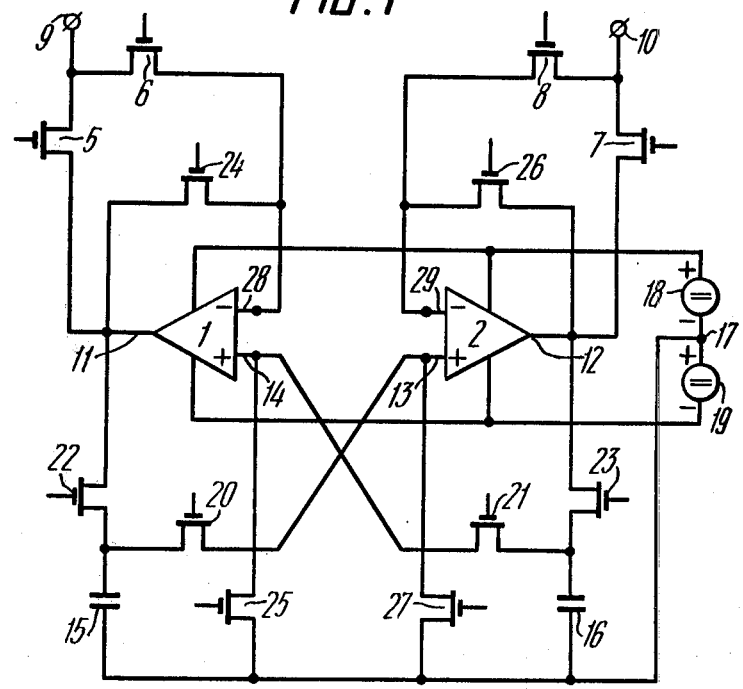
FIG. 2 is a schematic circuit diagram of the switching device according to the invention.

Each null bias voltage memory circuit 3 and 4 comprises respectively a capacitor 15, 16 (FIG. 2), the first lead of said capacitor being connected to a center tap 17 of the operational amplifier 1, 2 supply sources 18, 19. The second lead of the capacitors 15, 16 is connected through a respective keying element 20, 21 to non-inverting inputs 14, 13 of the amplifiers 1, 2, the lead of the capacitor 15 being connected through a keying element 20 to the non-inverting input 13 of the amplifier 2, while the lead of the capacitor 16 through a keying element 21 to the non-inverting input 14 of the amplifier 1. Besides, the second lead of each capacitor 15, 16 is connected to the output 11, 12 of the amplifiers 1, 2 respectively through charging keying elements 22, 23.

Each null bias voltage memory circuit 3, 4 (FIG. 1) also comprises two keying elements 24, 25 and 26, 27 (FIG. 2) adapted to short-circuit the inputs of the operational amplifier 1, 2. The keying elements 24, 26 are connected between the outputs 11, 12 of the respective amplifier 1, 2 and the inverting input 28, 29 thereof, while the keying elements 25, 27 - between the non-inverting input 14, 13 of the respective amplifier 1, 2 and the center tap 17 of the amplifier 1, 2 supply sources 18, 19.

The switching device operates as follows.

When a control unit (not shown) supplies a signal in the memory mode, the keying elements 22-27 are closed, now the non-inverting inputs 14, 13 of the operational amplifiers 1, 2 are connected to the center tap 17 of the supply sources 18, 19 of said operational amplifiers 1, 2. The keying elements 24, 26 connect the inverting inputs 28, 29 of the operational amplifiers to the outputs 11, 12 thereof thus enveloping the amplifiers with 100 percent negative feedbacks.

Voltages from the outputs 11, 12 of the operational amplifiers 1, 2 through the charging keying elements 22, 23 charge the capacitors 15 and 16 to a level of the null bias voltage of a corresponding operational amplifier. In the switching mode, the control unit signal closes the keying elements 5, 6, 7, 8, 20, 21 while the keying elements 22-27 get open. The memorized values of the operational amplifiers 1, 2 null bias voltages are fed through the keying elements 20, 21 to the non-inverting inputs 14, 13 of the respective operational amplifiers 1,2. In the switching mode the operational amplifiers 1, 2 are enveloped with 100 percent negative feedbacks by the keying elements 5, 6 and 7, 8 so that voltages equal to the algebraic sums of the original null bias voltage of one amplifier and the memorized value of the null bias voltage of the other operational amplifier exist at the outputs 11, 12 of the operational amplifiers 1, 2.

The null bias voltage of each operational amplifier 1, 2 are inserted in said algebraic sums with the same sign, since the memorized values of the null bias voltage are applied to the non-inverting inputs of the operational amplifiers 1, 2. The active switching components are connected in series and a difference between the algebraic sums of voltages existing at the outputs of the operational amplifiers 1, 2 appears between the input terminals 9, 10 and asmuch as said sums include similar members with similar signs, the voltage difference between terminals 9, 10 is zeroed. Thus a complete compensation for a residual voltage across the input terminals 9, 10 of the switching device is effected.

What is claimed is:

1. A switching device, comprising:
two identical active switching components connected in series and each comprising an operational amplifier having a negative feedback circuit, an inverting input, a non-inverting input, an output, supply sources, and a keying element in said negative feedback circuit;
two identical operational amplifier bias voltage memory circuits each having an input and an output; said input of each of said memory circuits being connected to said output of said operational amplifier; said output of each of said memory circuit being connected to said non-inverting input of said operational amplifier so that said output of the first memory circuit is connected to said non-inverting input of the operational amplifier with output connected said second memory circuit, said output of the second memory circuit being connected to said non-inverting input of the operational amplifier with output connected to said first memory circuit.

2. A switching device as claimed in claim 1, comprising:
said supply sources having a center tap; operational amplifier null bias voltage memory circuits including each a capacitor with two leads, one of said leads being connected to said center tap of the supply sources, a keying element connected to said other lead of said capacitor and to said noninverting input of said first operational amplifier, a charging keying element connected to said second lead of said capacitor and to said output of said other operational amplifier, a first keying element for short-circuiting the inputs of said operational amplifier connected between said output and inverting input of said operational amplifier, a second keying element for short-circuiting the inputs of the operational amplifier connected between said non-inverting input and said center tap of said supply sources.

3. A switching device as defined in claim 1, wherein initial voltages of the operational amplifiers and their drift are eliminated so that switching error due to inaccurate operation of the operational amplifiers is eliminated, said switching device operating in a cyclic mode of operation with periodic repetition of two modes comprised of storage of drift voltages of the operational amplifiers in the memory circuits and operational switching when stored drift voltages are used to reduce the switching error to zero.

4. A switching device as defined in claim 1, wherein initial voltages of the operational amplifiers and their drift are eliminated so that switching error due to inaccurate operation of the operational amplifiers is eliminated, said switching device operating in a cyclic mode of operation with periodic repetition of two modes comprised of storage of drift voltages of the operational amplifiers in the memory circuits and operational switching when stored drift voltages are used to reduce the switching error to zero, said switching components and memory circuits comprising symmetrical elements and interconnections.

5. A switching device as defined in claim 1, wherein said supply sources have a center tap; operational amplifier null bias voltage memory circuits including each a capacitor with two leads, one of said leads being connected to said center tap of the supply sources, a keying element connected to said other lead of said capacitor and to said non-inverting input of said first operational amplifier, a charging keying element connected to said second lead of said capacitor and to said output of said other operational amplifier, a first keying element for short-circuiting the inputs of said operational amplifier connected between said output and inverting input of said operational amplifier, a second keying element for short-circuiting the inputs of the operational amplifier connected between said non-inverting input and said center tap of said supply sources, initial voltages of the operational amplifiers and their drift being eliminated so that switching error due to inaccurate operation of the operational amplifiers is eliminated, said switching device operating in a cyclic mode of operation with periodic repetition of two modes comprised of storage of drift voltages of the operational amplifiers in the memory circuits and operational switching when stored drift voltages are used to reduce the switching error to zero, said switching components and memory circuits comprising symmetrical elements and interconnections.

6. A switching device as defined in claim 1, wherein said switching components and memory circuits comprise symmetrical elements and interconnections.

* * * * *